(12) United States Patent
Lee

(10) Patent No.: US 7,575,997 B2
(45) Date of Patent: Aug. 18, 2009

(54) METHOD FOR FORMING CONTACT HOLE OF SEMICONDUCTOR DEVICE

(75) Inventor: Sung-Kwon Lee, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 314 days.

(21) Appl. No.: 11/455,126

(22) Filed: Jun. 15, 2006

(65) Prior Publication Data

US 2007/0082482 A1    Apr. 12, 2007

(30) Foreign Application Priority Data

Oct. 12, 2005    (KR) .................. 10-2005-0096116
Oct. 12, 2005    (KR) .................. 10-2005-0096117

(51) Int. Cl.
    *H01L 21/4763*    (2006.01)
(52) U.S. Cl. ............... 438/631; 438/633; 438/636; 438/595; 438/303; 257/E21.495
(58) Field of Classification Search ......... 438/636–637, 438/631–633, 671, 595, 303
    See application file for complete search history.

(56) References Cited

U.S. PATENT DOCUMENTS

| | | | |
|---|---|---|---|
| 5,981,398 A | 11/1999 | Tsai et al. | |
| 7,371,461 B2 * | 5/2008 | Fuller et al. | 428/446 |
| 2003/0119307 A1 | 6/2003 | Berkiaris et al. | |
| 2005/0056940 A1 | 3/2005 | Sandhu et al. | |
| 2005/0136675 A1 | 6/2005 | Sandhu et al. | |
| 2005/0239002 A1 * | 10/2005 | Li | 430/316 |
| 2006/0205207 A1 * | 9/2006 | Chen et al. | 438/638 |

FOREIGN PATENT DOCUMENTS

| | | |
|---|---|---|
| KR | 10-2004-0059535 | 7/2004 |
| KR | 10-2005-0058205 | 6/2005 |
| KR | 10-2005-0074081 | 7/2005 |
| TW | 401599 | 8/2000 |
| TW | 466575 | 12/2001 |
| TW | I225274 | 12/2004 |

* cited by examiner

*Primary Examiner*—Thanh Nguyen
(74) *Attorney, Agent, or Firm*—Blakely, Sokoloff, Taylor & Zafman LLP

(57) ABSTRACT

A method for forming a contact hole of a semiconductor is provided. Conductive patterns are formed over a substrate. An insulation layer is formed over the substrate to bury the conductive patterns. A hard mask including an amorphous carbon layer and an oxide based layer are formed in sequential order over the insulation layer and the conductive pattern. The amorphous carbon layer and the oxide layer are selectively etched to form a mask pattern. The insulation layer is etched using the mask pattern as a mask to form a contact hole.

14 Claims, 8 Drawing Sheets

METHOD FOR FORMING CONTACT HOLE OF SEMICONDUCTOR DEVICE

FIELD OF THE INVENTION

The present invention relates to a method for fabricating a semiconductor device; and more particularly, to a method for forming a self-aligned contact hole of a semiconductor device.

DESCRIPTION OF RELATED ARTS

As semiconductor devices have been highly integrated, the need for hard masks has been increased. Typically, the hard masks are formed of a conductive layer or an insulation layer such as a polysilicon layer, a tungsten layer, a nitride layer, or a combination thereof.

However, since the aforementioned materials are generally deposited at a high temperature, a physical property of a layer to be etched may be changed, and during an alignment of the hard mask with respect to a lower layer for an overlap during performing of a photo-exposure process, the hard mask often interrupts the overlap. Thus, an alignment key needs to be formed and a mask etching process to expose the key is required. That is, a key opening process is performed.

Amorphous carbon is used as a hard mask material newly introduced to improve the above described limitations. Since the amorphous carbon cannot be used singly, a silicon oxynitride (SiON) layer is formed over an upper portion of the amorphous carbon as a hard mask to etch the amorphous carbon.

The amorphous carbon has not only a low deposition temperature but also a low-k value. Thus, the amorphous carbon does not require the above mentioned key opening process during a photo-exposure process. As the amorphous carbon having the above described properties has been used as a hard mask, semiconductor devices with a size less than approximately 100 nm has been actively developed.

As for a process of forming a deep contact hole using the amorphous carbon as a hard mask, an inter-layer insulation layer is deposited over a substrate and then, an amorphous carbon layer, a SiON layer, and an anti-reflective coating layer are sequentially deposited over the inter-layer insulation layer. A photoresist pattern is formed over the anti-reflective coating layer and then, the anti-reflective coating layer and the SiON layer are patterned using the photoresist pattern as an etch mask. The amorphous carbon layer is etched using the patterned anti-reflective coating layer and the patterned SiON layer.

Continuing with the process, the inter-layer insulation layer is selectively etched using the amorphous carbon layer as a mask to form a contact hole exposing the substrate.

If the above processes are performed, the patterned SiON layer and the patterned organic anti-reflective coating layer can be removed during the etching of the inter-layer insulation layer.

As for an etching process of a self-aligned contact hole having a shallow depth, i.e., a depth of a layer to be etched is equal to or less than approximately 5,000 Å, a touch chemical mechanical polishing (CMP) process that etches only the hard mask formed over a conductive layer is generally employed to maintain etch uniformity and to increase an etch margin. In this case, because the SiON layer remains while the amorphous carbon layer is deposited and a series of etching processes of forming the self-aligned contact are performed, defects may be induced in devices. This limitation will be examined in FIGS. 1A to 1D.

FIGS. 1A to 1D are cross-sectional views illustrating a typical method for forming a contact hole of a semiconductor device.

As shown in FIG. 1A, a plurality of gate patterns are formed on a substrate 11. Each of the gate patterns is formed by stacking a gate oxide layer (not shown), a gate conductive layer 12 and a gate hard mask 13.

A gate spacer layer 14 is deposited on the above resulting structure including the gate patterns.

Although not illustrated, an inter-layer insulation layer 15 is formed to cover the entire resulting structure and a planarization process is performed on the inter-layer insulation layer 15 to expose the top surface of the gate spacer layer 14 formed on the gate hard mask 13.

An amorphous carbon layer 16 is formed over the inter-layer insulation layer 15. A patterned silicon oxynitride (SiON) layer 17, and a patterned anti-reflective coating layer 18 are sequentially deposited thereon. A photoresist pattern 19 is formed over the patterned anti-reflective coating layer 18.

More specifically, the formation of the patterned silicon oxynitride (SiON) layer 17, and the patterned anti-reflective coating layer 18, although not shown, a SiON layer, and an anti-reflective coating layer are sequentially deposited on the amorphous carbon layer 16. Then, the anti-reflective coating layer and the SiON layer are etched using the photoresist pattern 19 as an etch mask.

As shown in FIG. 1B, the photoresist pattern 19 is stripped, and the amorphous carbon layer 16 is etched using the patterned anti-reflective coating layer 18 and the patterned SiON layer 17 as a mask. This patterned amorphous carbon layer is referred to as "amorphous carbon hard mask" denoted as reference numeral 16A. The patterned anti-reflective coating layer 18 is removed during this etching process.

As shown in FIG. 1C, the inter-layer insulation layer 15 is etched using the patterned SiON layer 17 and the amorphous carbon hard mask 16A. This patterned inter-layer insulation layer is denoted as reference numeral 15A. As a result of this etching process, a contact hole 20 is formed in the patterned inter-layer insulation layer 15. A large quantity of polymers P may be generated on sidewalls of the contact hole 20 during the etching of the inter-layer insulation layer 15.

As shown in FIG. 1D, an oxygen ($O_2$) plasma treatment process can be performed to remove the polymers P formed on the contact hole 20. The polymers P may be removed due to the $O_2$ plasma treatment process; however, the amorphous carbon hard mask 16A may also be damaged.

As described above, an inter-layer insulation layer is etched using a mask formed by stacking an amorphous carbon layer and a SiON layer. During forming a contact hole, a large quantity of polymers may be generated. An $O_2$ plasma treatment process can be performed to remove the polymers.

While the polymers are removed by performing the $O_2$ plasma treatment process, the amorphous carbon layer may also be etched and thus, a predetermined portion of the amorphous carbon layer is likely to be damaged. As a result, the SiON layer, which is a hard mask, and the amorphous carbon layer may be lifted up from the bottom layer. Hence, a subsequent process may not be performed smoothly and effectively.

SUMMARY OF THE INVENTION

An embodiment of the invention is a method for fabricating a contact hole of a semiconductor device, wherein the method is advantageous in reducing damage on a bottom hard mask including an amorphous carbon layer using an oxide based material instead of silicon oxynitride (SiON) as a top hard mask over the amorphous carbon layer.

In accordance with one aspect of the present invention, there is provided a method for forming a contact hole of a semiconductor device, including: forming a plurality of conductive patterns over a substrate; forming an insulation layer over the substrate to bury the conductive patterns; forming a hard mask including an amorphous carbon layer and an oxide based layer in sequential order over the insulation layer and the conductive pattern; selectively etching the amorphous carbon layer and the oxide layer to form a mask pattern; and etching the insulation layer using the mask pattern as a mask to form a contact hole.

In accordance with another aspect of the present invention, there is provided a method for forming a contact hole of a semiconductor device, including: forming a conductive pattern over a substrate; forming an insulation layer over the substrate to bury the conductive pattern; forming a hard mask including an amorphous carbon layer and an oxide based layer, over the insulation layer and the conductive pattern; etching the amorphous carbon layer and the oxide layer to form a mask pattern; and etching the insulation layer using the mask pattern as a mask to form a contact hole.

BRIEF DESCRIPTION OF THE DRAWINGS

The above features of an embodiment of the present invention will become better understood with respect to the following description of the exemplary embodiments given in conjunction with the accompanying drawings, in which.

DETAILED DESCRIPTION OF THE INVENTION

Hereinafter, detailed descriptions on certain embodiments of the present invention will be provided with reference to the accompanying drawings.

FIGS. 2A to 2F are cross-sectional views illustrating a method for fabricating a contact hole of a semiconductor device in accordance with an embodiment of the present invention.

Figure 1A:
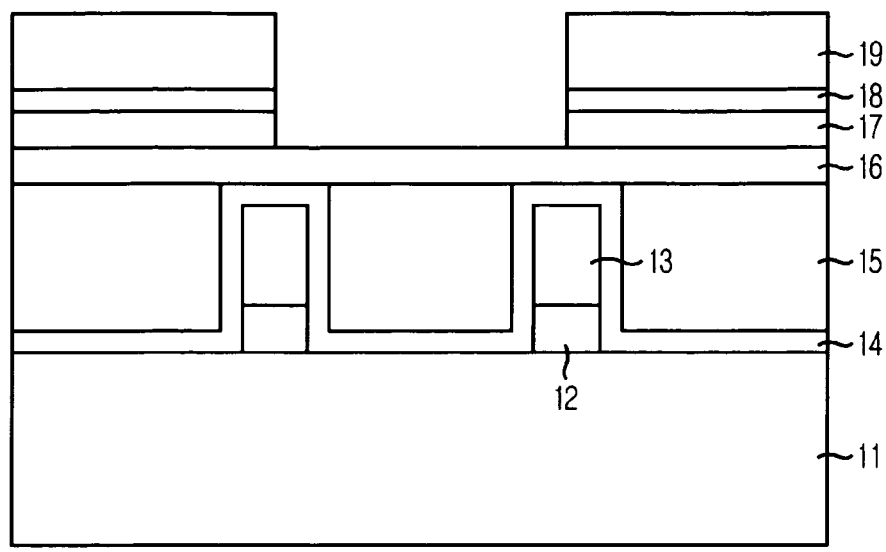
FIGS. 1A to 1D are cross-sectional views illustrating a typical method for forming a contact hole of a semiconductor device.
Figure 1B:
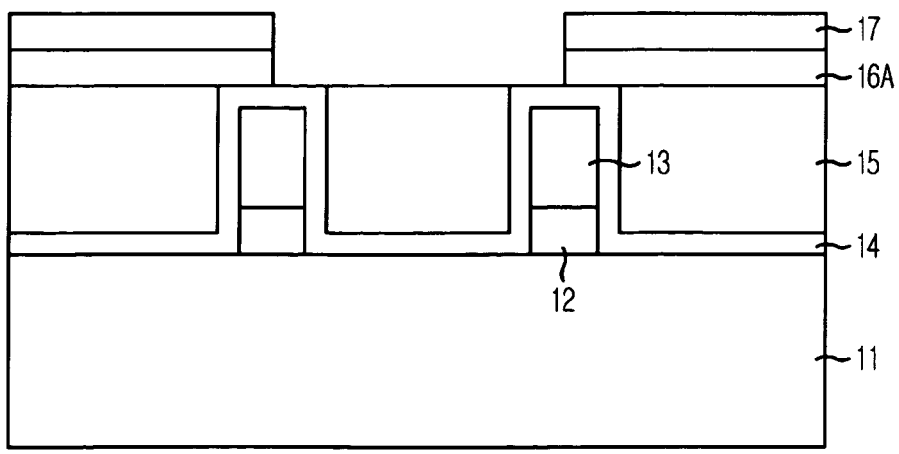
Figure 1C:
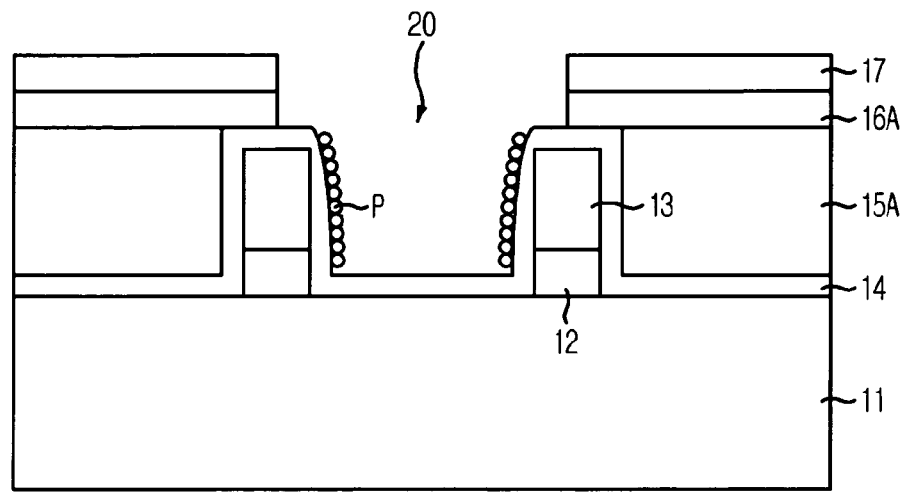
Figure 1D:
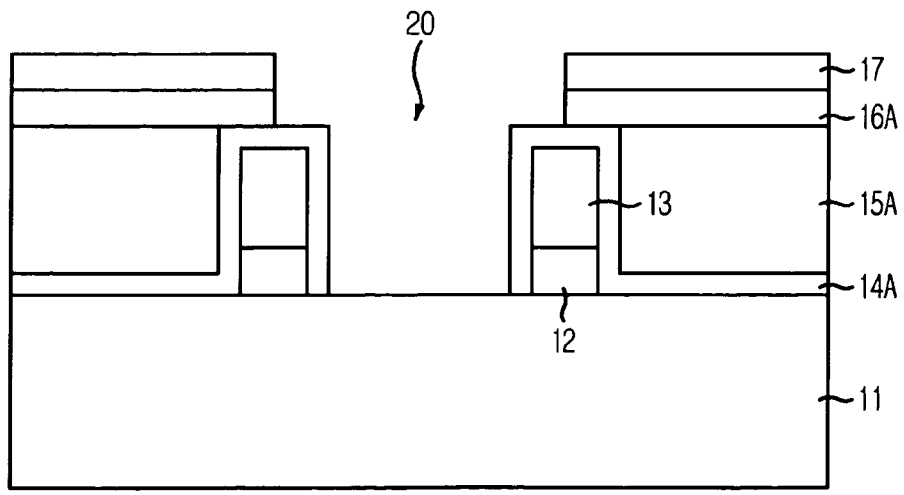
Figure 2A:
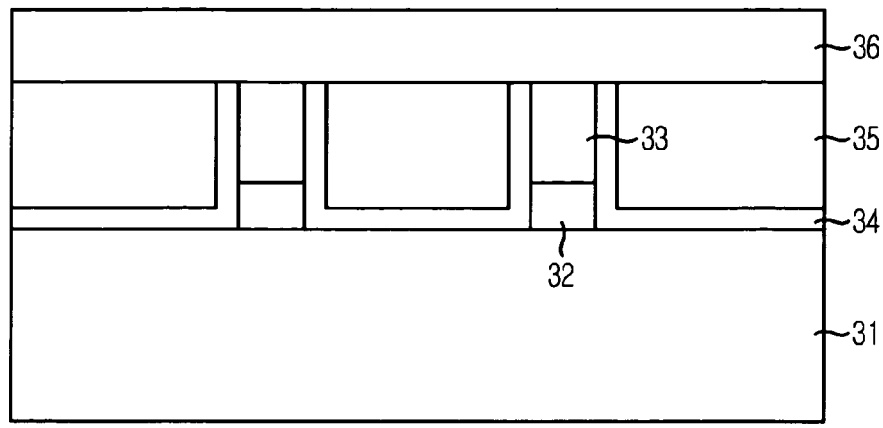
FIGS. 2A to 2F are cross-sectional views illustrating a method for forming a contact hole of a semiconductor device in accordance with an embodiment of the present invention.

As shown in FIG. 2A, a gate oxide layer (not shown) is grown over a substrate 31 by performing a thermal oxidation method, and a plurality of gate patterns are formed thereon. Each of the gate patterns is formed by stacking a gate conductive layer 32 and a gate hard mask 33.

A gate spacer layer 34 is deposited over a surface of the above resulting structure including the gate patterns.

An inter-layer insulation layer 35 is deposited over an entire surface including the gate patterns and the gate spacer layer 34. Then, a touch chemical mechanical polishing (CMP) process is performed until the gate spacer layer 34 formed over the gate hard masks 33 is exposed and the inter-layer insulation layer 35 is planarized.

The inter-layer insulation layer 35 can be formed using one selected from a group consisting of borosilicate glass (BSG) layer, a borophosphosilicate glass (BPSG) layer, a phosphosilicate glass (PSG) layer, a tetraethylorthosilicate (TEOS) layer, a high density plasma (HDP) oxide layer, a spin-on-glass (SOG) layer, and an advanced planarization layer (APL). In addition to the aforementioned oxide based layers, an organic or inorganic based low-k dielectric layer can be used.

An oxide layer 36 for buffering is formed over the inter-layer insulation layer 35. The oxide layer 36 serves a role in preventing the gate pattern from being lifted up. A HDP layer is deposited with a thickness ranging from approximately 100 Å to approximately 1,000 Å through one of a plasma enhanced chemical vapor deposition (PECVD) method and an atomic layer deposition (ALD) method to form the oxide layer 36.

Figure 2B:
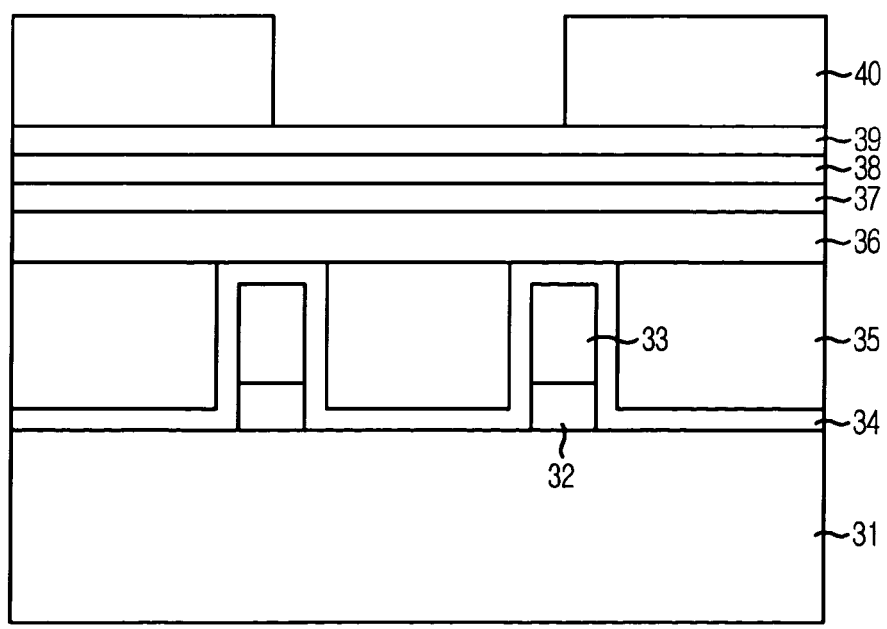

As shown in FIG. 2B, an amorphous carbon layer 37, an oxide based layer 38 for a hard mask, and an anti-reflective coating layer 39 are sequentially deposited over the oxide layer 36. A photoresist pattern 40 is formed over predetermined portions of the anti-reflective coating layer 39. The amorphous carbon layer 37 is formed with a thickness ranging from approximately 300 Å to approximately 2,000 Å. The oxide based layer 38 is formed by using silicon oxynitride (SiON) through one selected from a group consisting of a high density plasma (HDP) method, a plasma enhanced chemical vapor deposition (PECVD) method, and an atomic layer deposition (ALD) method.

Figure 2C:
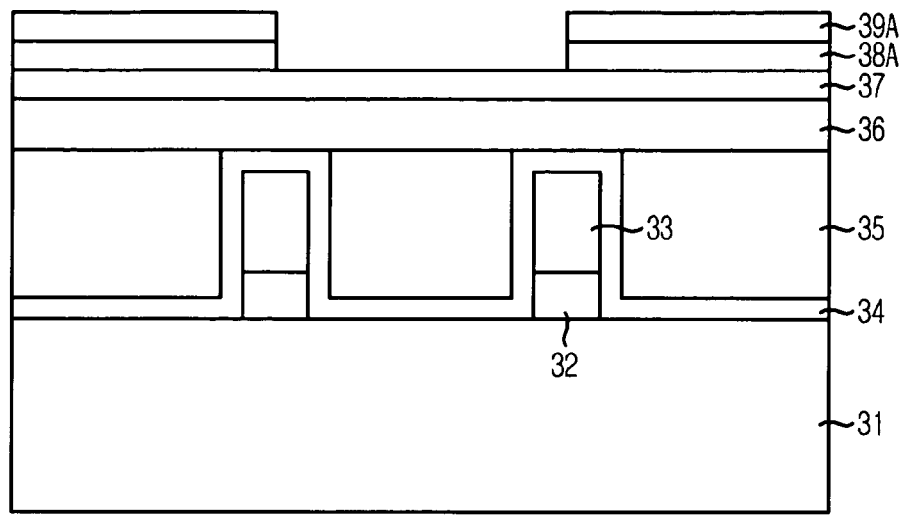

As shown in FIG. 2C, the anti-reflective coating layer 39 and the oxide based layer 38 are etched using the photoresist pattern 40 as an etch barrier to form a patterned anti-reflective coating layer 39A and a patterned oxide based layer 38A. Then, the photoresist pattern 40 is stripped away.

Figure 2D:
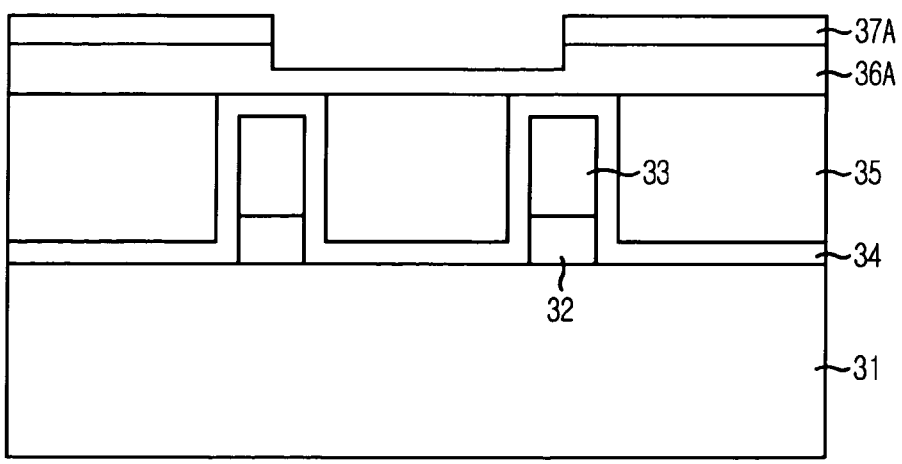

As shown in FIG. 2D, a predetermined portion of the amorphous carbon layer 37 is etched using the patterned anti-reflective coating layer 39A and the patterned oxide based layer 38A as an etch mask, thereby forming a patterned amorphous carbon layer 37A. The oxide layer 36 beneath the patterned amorphous carbon layer 37A can be also etched to a predetermined thickness. This patterned oxide layer is denoted as a reference numeral 36A.

During etching of the amorphous carbon layer 37, the patterned anti-reflective coating layer 39A and the patterned nitride oxide based layer 38A are also etched away.

The oxide based layer 38 may include a silicon nitride (SiN) layer, and the SiN layer may be deposited with a thickness ranging from approximately 100 Å to approximately 1,000 Å.

Figure 2E:
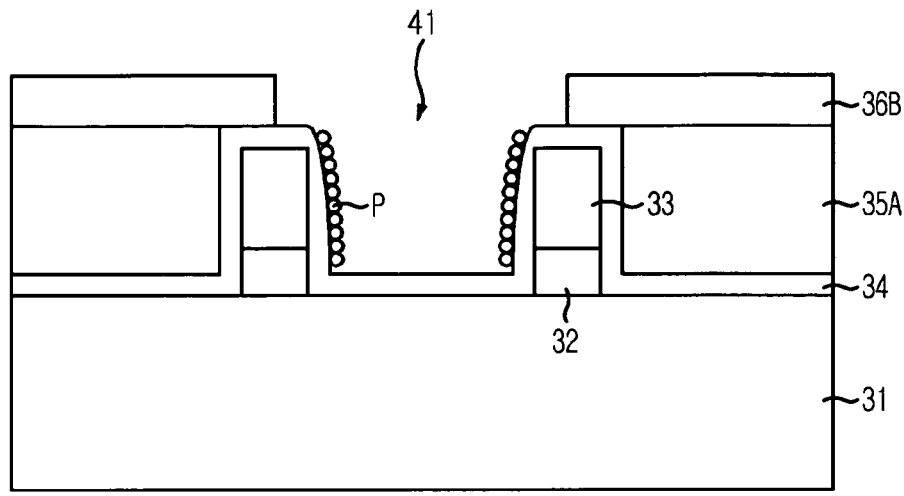

As shown in FIG. 2E, the patterned oxide layer 36A and the inter-layer insulation layer 35 are etched using the patterned amorphous carbon layer 37A as a main etch mask. This patterned inter-layer insulation layer 35 is denoted as reference numeral 35A, and this further patterned oxide layer is denoted as reference numeral 36B. As a result, a first contact hole 41 is formed in the patterned inter-layer insulation layer 35A and the further patterned oxide layer 36B.

Figure 2F:
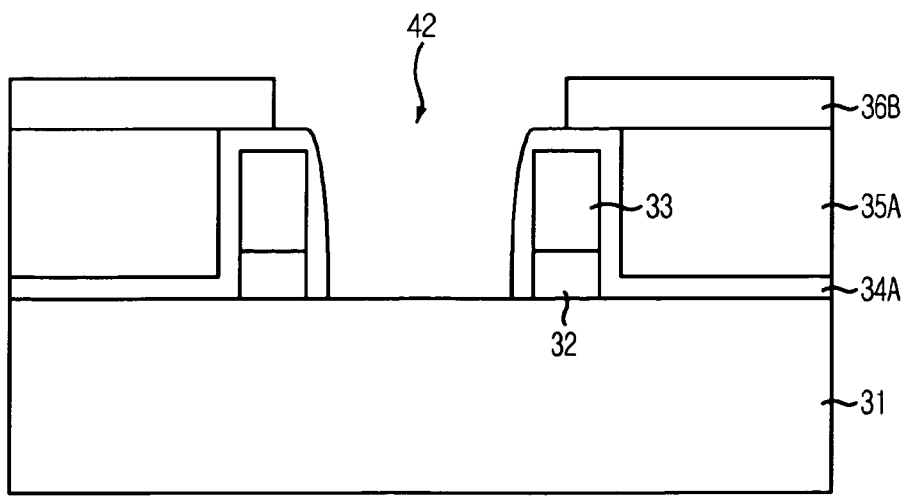

As shown in FIG. 2F, the gate spacer layer 34 formed over a bottom portion of the first contact hole 41 is selectively etched and removed. A second contact hole 42, exposing a region where a contact hole of the substrate 31 is to be formed, is formed. This patterned gate spacer layer is denoted as reference numeral 34A.

During the etching of the inter-layer insulation layer 35, polymers P are generally generated on sidewalls of the first contact hole 41. Although an oxygen ($O_2$) plasma treatment process is performed to remove the polymers P, the patterned oxide based layer 38A is not likely to be lifted up. Accordingly, it is possible to perform a subsequent process smoothly and effectively.

An embodiment of the present invention can be applied to the case where an organic material capable of generating polymers is used as the hard mask in addition to the amorphous carbon layer.

As described above, according to this embodiment of the present invention, when an amorphous carbon layer and an oxide based layer are used as a mask, since an oxide layer for buffering is formed beneath the amorphous carbon layer, it is possible to prevent damage to the amorphous carbon layer caused by the removal of polymers generated after an etching process to form a contact hole. Accordingly, it is also possible to reduce defect generation such as a lifting phenomenon generated during a self-aligned contact process.

FIGS. 3A to 3F are cross-sectional views illustrating a method for fabricating a contact hole of a semiconductor device in accordance with another embodiment of the present invention.

Figure 3A:
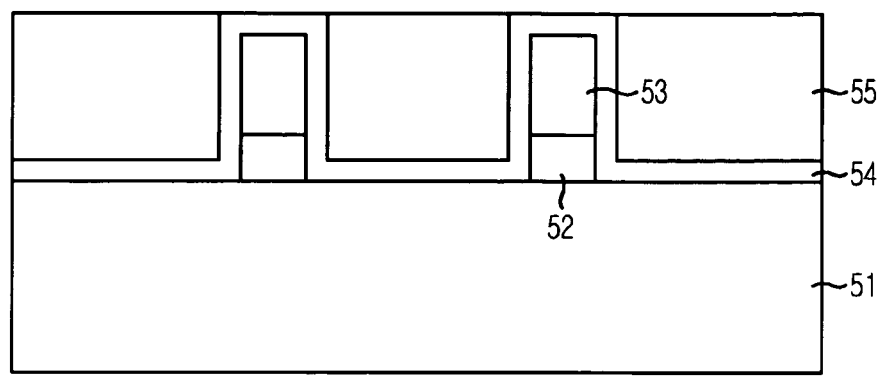
FIGS. 3A to 3F are cross-sectional views illustrating a method for forming a contact hole of a semiconductor device in accordance with another embodiment of the present invention.

As shown in FIG. 3A, a gate oxide layer (not shown) is grown over a substrate 51 on which a device isolation process is performed through a thermal oxidation method, and a plurality of gate patterns are thereon. Each of the gate patterns is formed by stacking a gate conductive layer 52 and a gate hard mask 53.

A gate spacer layer 54 is deposited over an entire surface of the substrate 51 including the gate patterns.

An inter-layer insulation layer 55 is formed over the above resulting structure including the gate spacer layer 54. A touch chemical mechanical polishing (CMP) process is performed until the gate spacer layer 54 formed over the gate patterns is exposed. As a result, the inter-layer insulation layer 55 is planarized.

Figure 3B:
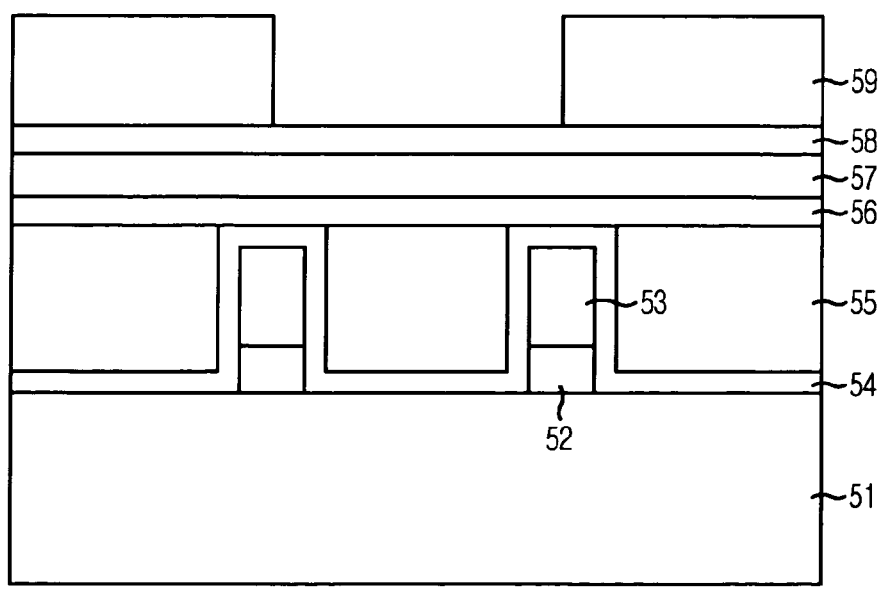

As shown in FIG. 3B, an amorphous carbon layer 56, an oxide based layer 57 for a hard mask, and an anti-reflective coating layer 58 are sequentially formed over the inter-layer insulation layer 55. A photoresist pattern 59 is formed over predetermined portions of the anti-reflective coating layer 58. The oxide based layer 57 can be deposited with a thickness ranging from approximately 100 Å to approximately 1,000 Å through one selected from a group consisting of a high density plasma (HDP) method, a plasma enhanced chemical vapor deposition (PECVD) method, and an atomic layer deposition (ALD) method, and the amorphous carbon layer 56 can be deposited with a thickness ranging from approximately 300 Å to approximately 2,000 Å.

Figure 3C:
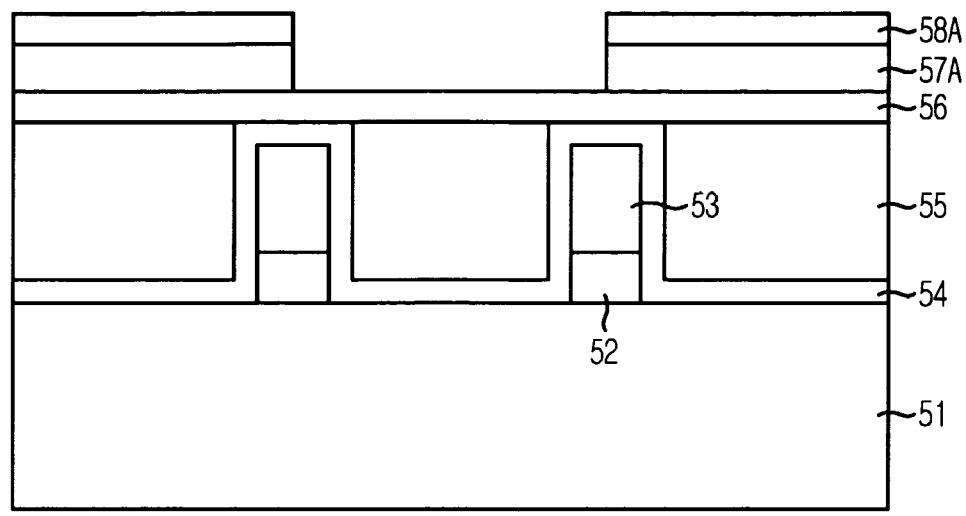

As shown in FIG. 3C, the anti-reflective coating layer 58 and the oxide based layer 57 are etched using the photoresist pattern 59 as an etch barrier to form a patterned oxide based layer 57A and a patterned anti-reflective coating layer 58A are formed. The photoresist pattern 59 is stripped.

Figure 3D:
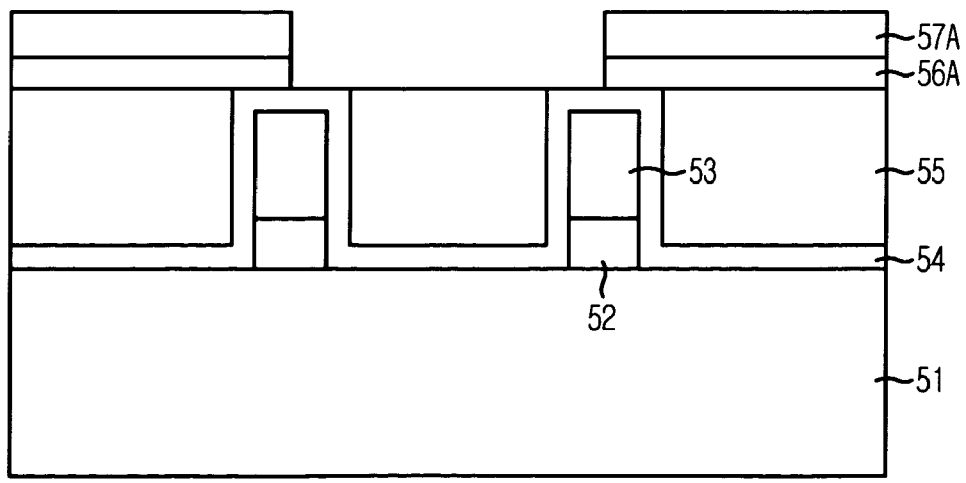

As shown in FIG. 3D, the amorphous carbon layer 56 is etched using the patterned oxide based layer 57A and the patterned anti-reflective coating layer 58A to form a patterned amorphous carbon layer 56A is formed. The patterned anti-reflective coating layer 58A is removed.

Figure 3E:
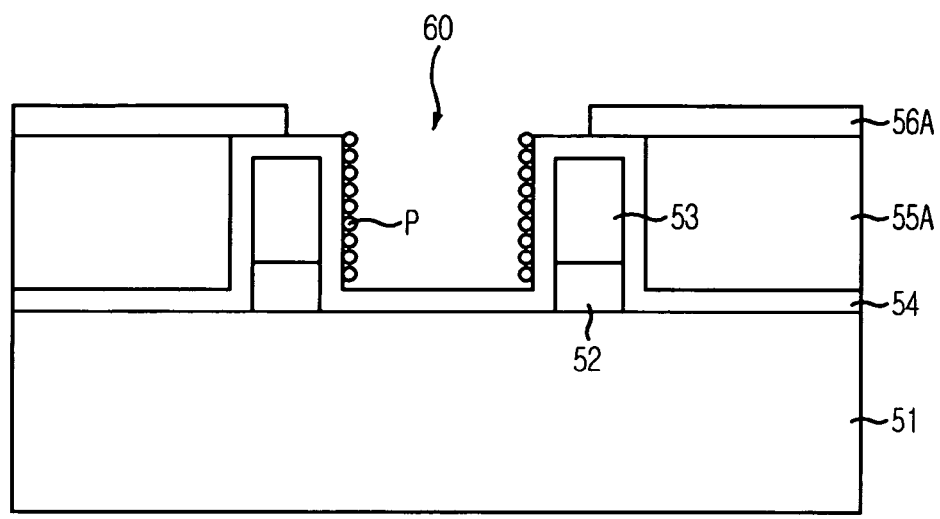

As shown in FIG. 3E, the inter-layer insulation layer 55 between the gate patterns is subjected to a self-aligned contact process using the patterned oxide based layer 57A and the patterned amorphous carbon layer 56A as an etch mask. This patterned inter-layer insulation layer is denoted as reference numeral 55A. A first contact hole 60 is formed until the gate spacer layer 54 formed over the substrate 51 between the patterned inter-layer insulation layer 55A is exposed.

During the self-aligned contact process, a large quantity of polymers P is generally generated over sidewalls of the contact hole 60. The patterned oxide based layer 57A is removed by using a fluorine based plasma.

Figure 3F:
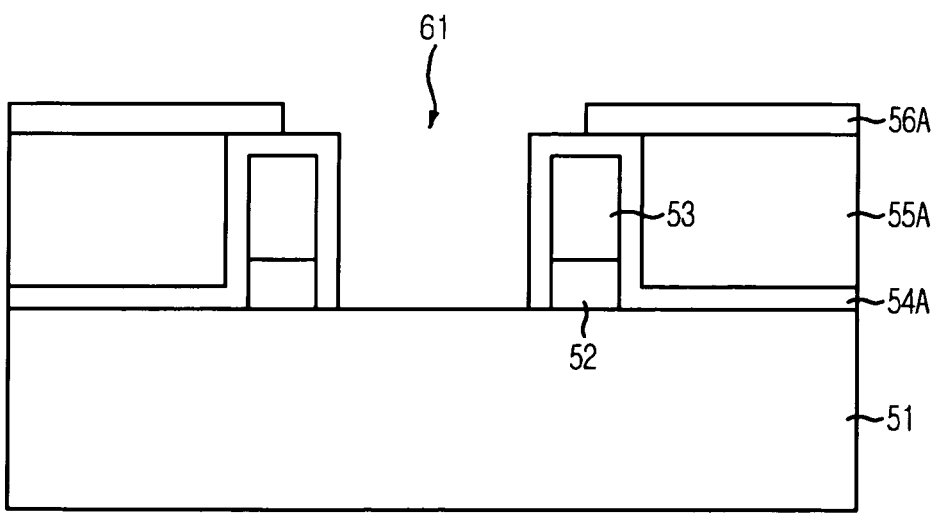

As show in FIG. 3F, the polymers P generated during the self-aligned contact process and the gate spacer layer 54 are selectively etched to expose the substrate 51 where a contact hole is to be formed. As a result, a second contact hole 61 is formed. This patterned gate spacer layer is denoted as reference numeral 54A. Thereafter, a process removing the patterned amorphous carbon layer 56A can be additionally performed. The removing of the polymers P and the etching process of the gate spacer layer 54 can be performed employing one of a dry etching process and a wet etching process.

The embodiment of the present invention can be applied to the case where an organic material capable of generating the polymers P is used as the hard mask in addition to the amorphous carbon layer.

Furthermore, in another embodiment, a silicon oxynitride (SiON) layer for a hard mask can be formed over the amorphous carbon layer and the oxide based layer and at this time, the SiON layer can be formed with a thickness ranging from approximately 50 Å to approximately 300 Å.

As described above, an oxide based layer is formed over an amorphous carbon layer, and the oxide based layer is etched using a fluorine based gas. Afterwards, the amorphous carbon layer is etched using a patterned oxide based layer and then, an inter-layer insulation layer is etched. During the etching of the inter-layer insulation layer, the patterned oxide based layer over a patterned amorphous carbon layer is naturally removed not to lift up the patterned amorphous carbon layer. Hence, a subsequent process can be performed smoothly and effectively.

In accordance with the above described embodiment of the present invention, when an amorphous carbon layer and oxide based layer are used as a self-aligned contact mask, a lifting up phenomenon can be prevented since the oxide based layer applied instead of the SiON layer is formed over the amorphous carbon layer.

The present application contains subject matter related to the Korean patent application Nos. KR 2005-0096116 and KR 2005-0096117, filed in the Korean Patent Office on Oct. 12, 2005, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A method for forming a contact hole of a semiconductor device, comprising:
    forming a plurality of conductive patterns over a substrate;
    forming an insulation layer over the substrate to bury the conductive patterns;
    planarizing the insulation layer until a top portion of the conductive patterns is exposed;
    forming a hard mask including an amorphous carbon layer and an oxide based layer in sequential order over the insulation layer and the conductive pattern;
    selectively etching the amorphous carbon layer and the oxide layer to form a mask pattern; and
    etching the insulation layer using the mask pattern as a mask to form a contact hole.

2. The method of claim 1, wherein the forming of the hard mask comprises:
    forming the amorphous carbon layer over the insulation layer and the conductive patterns;
    forming the oxide based layer over the amorphous carbon layer;

forming a photoresist pattern over predetermined portions of the oxide based layer;

selectively etching the oxide based layer using the photoresist pattern as an etch mask to form an oxide based hard mask;

stripping the photoresist pattern; and etching the amorphous carbon layer using the oxide based hard mask to form an amorphous carbon hard mask.

3. The method of claim 2, further comprising removing the oxide based hard mask and making the amorphous carbon hard mask remain after the forming of the contact hole.

4. The method of claim 2, further comprising removing the oxide based hard mask and the amorphous carbon hard mask after the forming of the contact hole.

5. The method of claim 1, wherein the oxide based layer is formed by using one selected from a group consisting of a high density plasma (HDP) method, a plasma enhanced chemical vapor deposition (PECVD) method, and an atomic layer deposition (ALD) method.

6. The method of claim 1, wherein the oxide based hard mask is formed in a thickness ranging from approximately 100 Å to approximately 1,000 Å.

7. The method of claim 1, wherein the amorphous carbon layer is formed in a thickness ranging from approximately 300 Å to approximately 2,000 Å.

8. The method of claim 1, wherein the planarizing is performed by using a touch chemical mechanical polishing (CMP) process.

9. The method of claim 1, after the forming of the hard mask, further comprising forming an anti-reflective coating layer over the hard mask.

10. The method of claim 2, further comprising forming a SiON based hard mask layer over the oxide based layer.

11. The method of claim 10, wherein the SiON hard mask layer is formed in a thickness ranging from approximately 50 Å to approximately 300 Å.

12. A method for forming a contact hole of a semiconductor device, comprising:

forming a conductive pattern over a substrate;

forming an insulation layer over the substrate to bury the conductive pattern;

planarizing the insulation layer until a top portion of the conductive patterns is exposed;

forming an oxide-based layer for buffering over the insulation layer and the conductive pattern;

forming a hard mask including an amorphous carbon layer over the oxide-based layer;

etching the amorphous carbon layer and the oxide based layer to form a mask pattern; and etching the insulation layer using the mask pattern as a mask to form a contact hole.

13. The method of claim 12, wherein the oxide-based layer includes a high density plasma (HDP) layer.

14. The method of claim 13, wherein the HDP layer is formed by using one selected from a group consisting of a high density plasma (HDP) method, a plasma enhanced chemical vapor deposition (PECVD) method, and an atomic layer deposition (ALD) method.

* * * * *